(12) United States Patent
Otani (10) Patent No.: US 10,158,081 B2
(45) Date of Patent: Dec. 18, 2018

(54) CHARGE-TRANSPORTING VARNISH (71) Applicant: NISSAN CHEMICAL INDUSTRIES, LTD., Tokyo (JP)

(72) Inventor: Naoki Otani, Funabashi (JP)

(73) Assignee: NISSAN CHEMICAL INDUSTIRES, LTD., Tokyo (JP)

( * ) Notice: Subject to any disclaimer, the term of this patent is extended or adjusted under 35 U.S.C. 154(b) by 603 days.

(21) Appl. No.: 14/771,099

(22) PCT Filed: Feb. 24, 2014

(86) PCT No.: PCT/JP2014/054312
§ 371 (c)(1),
(2) Date: Aug. 27, 2015

(87) PCT Pub. No.: WO2014/132917
PCT Pub. Date: Sep. 4, 2014

(65) Prior Publication Data
US 2016/0005972 A1  Jan. 7, 2016

(30) Foreign Application Priority Data

Feb. 28, 2013  (JP) ................................. 2013-038818
May 28, 2013  (JP) ................................. 2013-111465

(51) Int. Cl.
| | |
|---|---|
| *H01L 51/00* | (2006.01) |
| *H01L 51/56* | (2006.01) |
| *H01L 51/50* | (2006.01) |
| *C08G 16/02* | (2006.01) |
| *C09D 161/00* | (2006.01) |
| *C09D 179/02* | (2006.01) |
| *C09K 11/06* | (2006.01) |
| *C08G 61/12* | (2006.01) |
| *C09D 165/00* | (2006.01) |
| *C08G 73/02* | (2006.01) |

(52) U.S. Cl.
CPC ...... *H01L 51/0043* (2013.01); *C08G 16/0225* (2013.01); *C08G 16/0231* (2013.01); *C09D 161/00* (2013.01); *C09D 179/02* (2013.01); *C09K 11/06* (2013.01); *H01L 51/0059* (2013.01); *H01L 51/5056* (2013.01); *H01L 51/5088* (2013.01); *H01L 51/56* (2013.01); *C08G 61/12* (2013.01); *C08G 73/026* (2013.01); *C08G 2261/12* (2013.01); *C08G 2261/148* (2013.01); *C08G 2261/3142* (2013.01); *C08G 2261/3162* (2013.01); *C08G 2261/3326* (2013.01); *C08G 2261/46* (2013.01); *C08G 2261/512* (2013.01); *C08G 2261/95* (2013.01); *C09D 165/00* (2013.01); *C09K 2211/1014* (2013.01); *C09K 2211/1416* (2013.01)

(58) Field of Classification Search
None
See application file for complete search history.

(56) References Cited

U.S. PATENT DOCUMENTS

| | | | |
|---|---|---|---|
| 8,298,444 | B2 | 10/2012 | Yamada et al. |
| 8,357,770 | B2 | 1/2013 | Yoshimoto et al. |
| 8,906,519 | B2 | 12/2014 | Kato et al. |
| 2011/0037058 | A1 | 2/2011 | Buchholz et al. |

FOREIGN PATENT DOCUMENTS

| | | |
|---|---|---|
| JP | 2009-43896 A | 2/2009 |
| JP | 2011-501449 A | 1/2011 |
| WO | WO 2008/032616 A1 | 3/2008 |
| WO | WO 2008/032617 A1 | 3/2008 |
| WO | WO 2008/129947 A1 | 10/2008 |
| WO | WO 2010/058777 A1 | 5/2010 |

OTHER PUBLICATIONS

Adachi et al. "Electroluminescence in Organic Films with Three-Layer Structure", Japanese Journal of Applied Physics, vol. 27, No. 2, Feb. 1988, pp. L269-L271.
International Search Report, issued in PCT/JP2014/054312, dated May 20, 2014.
Ochi et al. "Preparation of Linear Oligoaniline Derivatives Using Titanium Alkoxide as a Condensing Agent", Bulletin of Chemical Society of Japan, vol. 67, (1994), pp. 1749-1752.
Written Opinion Opinion of the International Searching Authority, issued in PCT/JP2014/054312, dated May 20, 2014.
Zhang et al. "Synthesis of Oligomeric Anilines", Synthetic Metals, vol. 84, (1997), pp. 119-120.

*Primary Examiner* — Jay Yang
(74) *Attorney, Agent, or Firm* — Birch, Stewart, Kolasch & Birch, LLP (57) ABSTRACT

Provided is a charge-transporting varnish which includes a charge-transporting material including fluorine atoms, a charge-transporting material not including fluorine atoms, a dopant material comprising heteropoly acid, and an organic solvent, said charge-transporting material including fluorine atoms being a polymer of weight-average 1,000 to 200,000 molecular weight obtained by condensing a triarylamine compound, an aryl aldehyde compound including fluorine atoms, and a fluorine derivative having a carbonyl group, and said charge-transporting material not including fluorine atoms being an oligoaniline compound. The charge-transporting varnish provides a thin film which, even in a case of being used as a single layer in contact with and in between an anode and a luminescent layer, is capable of achieving an organic EL element having superior luminance characteristics and durability.

15 Claims, 1 Drawing Sheet

CHARGE-TRANSPORTING VARNISH

TECHNICAL FIELD

The present invention relates to a charge-transporting varnish.

BACKGROUND ART

Charge-transporting thin-films are used in organic electroluminescence (organic EL) devices.

Processes for forming such charge-transporting thin-films are broadly divided into dry processes such as vapor deposition and wet processes such as spin coating. These processes can be selectively used as appropriate according to the surface area of the thin-film to be formed and the solubility in organic solvents of the material to be rendered into a thin-film.

Generally, between the positive electrode and the emissive layer of an organic EL device, two layers—a layer called the hole injection layer and a layer called the hole transport layer—are arranged in this order from the positive electrode side. Providing two such layers makes efficient charge transport possible, enabling an organic EL device having high brightness characteristics to be obtained (see, for example, Non-Patent Document 1).

Yet, on the other hand, organic EL device production processes also have the drawback that independent steps are normally required to form these layers.

Lately in the field of electronic devices, there exists a desire, in order to efficiently manufacture devices at a high yield, for process simplification and greater simplicity in the device structure.

In particular, by replacing a functional multilayer film obtained by stacking a plurality of films in the device with a single film, not only can the manufacturing process be simplified, it is also possible to directly simplify the device structure. Hence, in connection with various electronic devices, there exists a desire for materials capable of producing functional single films that can be substituted for existing functional multilayer films.

In the field of organic EL devices as well, there is an increasing desire for materials that can replace a functional multilayer film typically composed of a hole injection layer and a hole transport layer with a single film.

PRIOR ART DOCUMENT

Non-Patent Document

Non-Patent Document 1: Adachi, C. et al., *Jpn. J. Appl. Phys.*, 1988, 27(2), pp. L269-271

SUMMARY OF THE INVENTION

Problems to be Solved by the Invention

It is therefore an object of the present invention to provide a charge-transporting varnish that gives a thin-film which enables an organic EL device having excellent brightness characteristics and durability to be achieved, even when used as a single layer between a positive electrode and an emissive layer in a form that contacts both.

Means for Solving the Problems

The inventors have conducted extensive investigations, as a result of which they have discovered that a thin-film obtained from a charge-transporting varnish containing a specific charge-transporting material which includes fluorine atoms, a specific charge-transporting material which does not include fluorine atoms, and a dopant material composed of a heteropolyacid, even when used as a single layer between a positive electrode and an emissive layer in a form that contacts both, gives an organic EL device having excellent brightness characteristics and durability.

Accordingly, the invention provides:
1. A charge-transporting varnish characterized by including a charge-transporting material containing fluorine atoms, a charge-transporting material not containing fluorine atoms, a dopant material composed of a heteropolyacid, and an organic solvent, wherein the charge-transporting material containing fluorine atoms is a polymer having a weight-average molecular weight of from 1,000 to 200,000 which is obtained by condensation of a triarylamine compound with a fluorine atom-containing arylaldehyde compound and a carbonyl group-bearing fluorene derivative, and the charge-transporting material not containing fluorine atoms is an oligoaniline compound;
2. The charge-transporting varnish according to 1 above, wherein the charge-transporting material containing fluorine atoms is a polymer obtained by condensation of a triarylamine compound of formula (1) with a fluorine atom-containing arylaldehyde compound of formula (2) and a carbonyl group-bearing fluorene derivative of formula (3) or formula (4)

[Chemical Formula 1]

(1)

(2)

(3)

(4)

(wherein $Ar^1$ to $Ar^3$ are each independently an aryl group of 6 to 20 carbons which may be substituted with $Z^1$, with at least one constituent carbon atom in each aryl group being unsubstituted; $Ar^4$ is an aryl group of 6 to 20 carbons which is substituted with at least one $Z^3$ and may also be substituted with $Z^4$; $R^1$ to $R^8$ are each independently a hydrogen atom, a halogen atom, a nitro group, a cyano group, or an alkyl group of 1 to 20 carbons, alkenyl group of 2 to 20 carbons or alkynyl group of 2 to 20 carbons which may be substituted with $Z^2$; $R^9$ and $R^{10}$ are each independently a hydrogen atom, an alkyl group of 1 to 20 carbons, (poly)ethylene oxide group of 2 to 20 carbons, alkenyl group of 2 to 20 carbons or alkynyl group of 2 to 20 carbons which may be substituted with $Z^2$, or an alkyl group of 1 to 20 carbons which is substituted with an ethenyl or ethynyl group and may also be substituted with $Z^2$; $Z^1$ is a halogen atom, a nitro group, a cyano group, or an alkyl group of 1 to 20 carbons, alkenyl group of 2 to 20 carbons or alkynyl group of 2 to 20 carbons which may be substituted with $Z^2$; $Z^2$ is a halogen atom, a nitro group or a cyano group; $Z^3$ is a fluorine atom, a fluorinated alkyl group of 1 to 20 carbons, or a fluorinated aryl group of 6 to 20 carbons; $Z^4$ is a chlorine atom, a bromine atom, an iodine atom, a nitro group, a cyano group, or an alkyl group of 1 to 20 carbons, alkenyl group of 2 to 20 carbons or alkynyl group of 2 to 20 carbons which may be substituted with $Z^5$; and $Z^5$ is a chlorine atom, a bromine atom, an iodine atom, a nitro group or a cyano group);

3. The charge-transporting varnish according to 2 above, wherein the triarylamine compound is a triphenylamine derivative of formula (5)

[Chemical Formula 2]

(5)

(wherein $R^{11}$ to $R^{22}$ are each independently a hydrogen atom, a halogen atom, a nitro group, a cyano group, or an alkyl group of 1 to 20 carbons, alkenyl group of 2 to 20 carbons or alkynyl group of 2 to 20 carbons which may be substituted with $Z^2$, $Z^2$ being the same as defined above);

4. The charge-transporting varnish according to 2 or 3 above, wherein the arylaldehyde compound is a benzaldehyde derivative of formula (6) or formula (7)

[Chemical Formula 3]

(6)

(7)

(wherein $R^{23}$ is a fluorine atom or a fluorinated alkyl group of 1 to 20 carbons; $R^{24}$ to $R^{27}$ are each independently a hydrogen atom, a nitro group, a cyano group, or an alkyl group of 1 to 20 carbons which may be substituted with a nitro or cyano group; and $R^{28}$ to $R^{32}$ are each independently a fluorine atom or a fluorinated alkyl group of 1 to 20 carbons); 5. The charge-transporting varnish according to any one of 1 to 4 above, wherein the oligoaniline compound has formula (8)

[Chemical Formula 4]

(8)

(wherein $R^{33}$ to $R^{38}$ are each independently a hydrogen atom, a halogen atom (exclusive of a fluorine atom), a nitro group, a cyano group, an alkyl group of 1 to 20 carbons, alkenyl group of 2 to 20 carbons or alkynyl group of 2 to 20 carbons which may be substituted with $Z^6$, an aryl group of

6 to 20 carbons or heteroaryl group of 2 to 20 carbons which may be substituted with $Z^7$, $-NHY^2$, $-NHY^3Y^4$, $-C(O)Y^5$, $-OY^6$, $-SY^7$, $-SO_3Y^8$, $-C(O)OY^9$, $-OC(O)Y^{10}$, $-C(O)NHY^{11}$ or $-C(O)NY^{12}Y^{13}$; $Y^2$ to $Y^{13}$ are each independently an alkyl group of 1 to 20 carbons, alkenyl group of 2 to 20 carbons or alkynyl group of 2 to 20 carbons which may be substituted with $Z^6$, or an aryl group of 6 to 20 carbons or heteroaryl group of 2 to 20 carbons which may be substituted with $Z^7$; $X^1$ is $-NY^1-$, $-O-$, $-S-$, $-(CR^{39}R^{40})_l-$ or a single bond, with $R^{39}$ and $R^{40}$ being the same as defined for $R^{33}$; l is an integer from 1 to 20; $Y^1$ is independently at each occurrence a hydrogen atom, an alkyl group of 1 to 20 carbons, alkenyl group of 2 to 20 carbons or alkynyl group of 2 to 20 carbons which may be substituted with $Z^6$, or an aryl group of 6 to 20 carbons or heteroaryl group of 2 to 20 carbons which may be substituted with $Z^7$; $Z^6$ is a halogen atom (exclusive of a fluorine atom), a nitro group, a cyano group, or an aryl group of 6 to 20 carbons or heteroaryl group of 2 to 20 carbons which may be substituted with $Z^8$; $Z^7$ is a halogen atom (exclusive of a fluorine atom), a nitro group, a cyano group, or an alkyl group of 1 to 20 carbons, alkenyl group of 2 to 20 carbons or alkynyl group of 2 to 20 carbons which may be substituted with $Z^8$; $Z^8$ is a halogen atom (exclusive of a fluorine atom), a nitro group or a cyano group; and m and n are each independently an integer from 1 to 10 and together satisfy the condition m+n≤10);

6. The charge-transporting varnish according to any one of 1 to 5 above, wherein the heteropolyacid compound is phosphotungstic acid;
7. The charge-transporting varnish according to any one of 1 to 6 above, which further comprises a curing agent;
8. The charge-transporting varnish according to 7 above, wherein the curing agent is an acrylate curing agent;
9. A charge-transporting film produced using the charge-transporting varnish of any one of 1 to 8 above;
10. An electronic device having the charge-transporting thin-film of 9 above;
11. An organic electroluminescence device having the charge-transporting thin-film of 9 above;
12. An organic electroluminescence device comprising at least a positive electrode, a negative electrode, an emissive layer and the charge-transporting thin-film of 9 above, which device includes the charge-transporting thin-film between the positive electrode and the emissive layer in a form that contacts each of these layers;
13. A method of producing a charge-transporting thin-film, characterized by coating the charge-transporting varnish of any one of 1 to 8 above onto a substrate and evaporating off the solvent;
14. A method of producing an organic electroluminescence device using the charge-transporting thin-film of 9 above; and
15. A polymer characterized by being obtained by condensation of a triarylamine compound of formula (1) with a fluorine atom-containing arylaldehyde compound of formula (2) and a carbonyl group-bearing fluorene derivative of formula (3) or formula (4), and by having a weight-average molecular weight of from 1,000 to 200,000

[Chemical Formula 5]

(1)

(wherein $Ar^1$ to $Ar^3$ are each independently an aryl group of 6 to 20 carbons which may be substituted with $Z^1$, with at least one constituent carbon atom in each aryl group being unsubstituted; $Ar^4$ is an aryl group of 6 to 20 carbons which is substituted with at least one $Z^3$ and may also be substituted with $Z^4$; $R^2$ to $R^8$ are each independently a hydrogen atom, a halogen atom, a nitro group, a cyano group, or an alkyl group of 1 to 20 carbons, alkenyl group of 2 to 20 carbons or alkynyl group of 2 to 20 carbons which may be substituted with $Z^2$; $R^9$ and $R^{10}$ are each independently a hydrogen atom, an alkyl group of 1 to 20 carbons, (poly)ethylene oxide group of 2 to 20 carbons, alkenyl group of 2 to 20 carbons or alkynyl group of 2 to 20 carbons which may be substituted with $Z^2$, or an alkyl group of 1 to 20 carbons which is substituted with an ethenyl or ethynyl group and may also be substituted with $Z^2$; $Z^2$ is a halogen atom, a nitro group, a cyano group, or an alkyl group of 1 to 20 carbons, alkenyl group of 2 to 20 carbons or alkynyl group of 2 to 20 carbons which may be substituted with $Z^2$; $Z^2$ is a halogen atom, a nitro group or a cyano group; $Z^3$ is a fluorine atom, a fluorinated alkyl group of 1 to 20 carbons, or a fluorinated aryl group of 6 to 20 carbons; $Z^4$ is a chlorine atom, a bromine atom, an iodine atom, a nitro group, a cyano group, or an alkyl group of 1 to 20 carbons, alkenyl group of 2 to 20 carbons or alkynyl group of 2 to 20 carbons which may be substituted with $Z^5$; and $Z^5$ is a chlorine atom, a bromine atom, an iodine atom, a nitro group or a cyano group).

Advantageous Effects of the Invention

The charge-transporting varnish of the invention, even when formed into a thin-film that exists as a single layer between a positive electrode and an emissive layer in a form that contacts both, is able to give an organic EL device having excellent brightness characteristics and durability. Although the reasons for this are not entirely clear, it is thought that, because the charge-transporting material containing fluorine atoms readily migrates to the surface side (emissive layer side) of the thin-film, there arises an uneven distribution of the charge-transporting material containing fluorine atoms primarily on the surface side (emissive layer side) of the thin-film and of the charge-transporting material not containing fluorine atoms primarily on the back side (positive electrode side), leading to phase separation within the single layer into a hole injection region and a hole transport region, with hole injecting components decreasing and hole transporting components increasing from the positive electrode toward the emissive layer. As a result, the thin-film functions as a hole injection/transport layer similar to cases in which these two layers are present.

By using the charge-transporting varnish of the invention, the functional multilayer film in a device can be replaced by a single film, enabling higher yield and lower costs due to simplification of the manufacturing process conditions, and also making it possible to achieve devices that are, for example, more lightweight and compact.

Also, the charge-transporting varnish of the invention can reproducibly produce thin-films of excellent charge transportability even using various wet processes capable of film formation over a large surface area, such as spin coating or slit coating, and is thus capable of fully accommodating recent advances in the field of organic EL devices.

In addition, thin-films obtained from the charge-transporting varnish of the invention can also be used as, for example, antistatic coatings or as anode buffer layers in organic thin-film solar cells.

EMBODIMENT FOR CARRYING OUT THE INVENTION

The invention is described more fully below.

The charge-transporting varnish according to the invention is characterized by including a charge-transporting material containing fluorine atoms, a charge-transporting material not containing fluorine atoms, a dopant material composed of a heteropolyacid, and an organic solvent, wherein the charge-transporting material containing fluorine atoms is a polymer having a weight-average molecular weight of from 1,000 to 200,000 which is obtained by condensation of a triarylamine compound with a fluorine atom-containing arylaldehyde compound and a carbonyl group-bearing fluorene derivative, and the charge-transporting material not containing fluorine atoms is an oligoaniline compound.

In this invention, "charge-transporting" is synonymous with electrically conductive, and means the same thing as hole-transporting. A "charge-transporting material" may be a material which is itself charge-transporting or may be a material which is charge-transporting when used together with a dopant material. The charge-transporting varnish of the invention may itself have charge transportability, or a solid film obtained from the varnish may have charge transportability.

In the invention, the triarylamine compound used to produce the charge-transporting material containing fluorine atoms is not particularly limited, although compounds of formula (1) are preferred.

[Chemical Formula 6]

(1)

In formula (1), $Ar^1$ to $Ar^3$ are each independently an aryl group of 6 to 20 carbons which may be substituted with $Z^1$. However, because sites that contribute to the condensation reaction with the aldehyde compound and the fluorene derivative are required, at least one constituent carbon atom in each aryl group is unsubstituted (that is, the carbon atom has a hydrogen atom thereon).

Specific examples of aryl groups of 6 to 20 carbons include phenyl, 1-naphthyl, 2-naphthyl, 1-anthryl, 2-anthryl, 9-anthryl, 1-phenanthryl, 2-phenanthryl, 3-phenanthryl, 4-phenanthryl and 9-phenanthryl groups, although a phenyl group which may be substituted with $Z^1$ is preferred.

The substituting group $Z^1$ is a halogen atom, a nitro group, a cyano group, or an alkyl group of 1 to 20 carbons, alkenyl group of 2 to 20 carbons or alkynyl group of 2 to 20 carbons which may be substituted with $Z^2$. $Z^2$ is a halogen atom, a nitro group or a cyano group.

Examples of the halogen atom include fluorine, chlorine, bromine and iodine atoms.

The alkyl group of 1 to 20 carbons may be linear, branched or cyclic. Illustrative examples include linear or branched alkyl groups of 1 to 20 carbons, such as methyl, ethyl, n-propyl, isopropyl, n-butyl, isobutyl, s-butyl, t-butyl, n-pentyl, n-hexyl, n-heptyl, n-octyl, n-nonyl and n-decyl groups; and cycloalkyl groups of 3 to 20 carbons, such as cyclopropyl, cyclobutyl, cyclopentyl, cyclohexyl, cycloheptyl, cyclooctyl, cyclononyl, cyclodecyl, bicyclobutyl, bicyclopentyl, bicyclohexyl, bicycloheptyl, bicyclooctyl, bicyclononyl and bicyclodecyl groups Examples of alkenyl groups of 2 to 20 carbons include ethenyl, n-1-propenyl, n-2-propenyl, 1-methylethenyl, n-1-butenyl, n-2-butenyl, n-3-butenyl, 2-methyl-1-propenyl, 2-methyl-2-propenyl, 1-ethylethenyl, 1-methyl-1-propenyl, 1-methyl-2-propenyl, n-1-pentenyl, n-1-decenyl and n-1-eicosenyl groups.

Examples of alkynyl groups of 2 to 20 carbons include ethynyl, n-1-propynyl, n-2-propynyl, n-1-butynyl, n-2-butynyl, n-3-butynyl, 1-methyl-2-propynyl, n-1-pentynyl, n-2-pentynyl, n-3-pentynyl, n-4-pentynyl, 1-methyl-n-butynyl, 2-methyl-n-butynyl, 3-methyl-n-butynyl, 1,1-dimethyl-n-propynyl, n-1-hexynyl, n-1-decynyl, n-1-pentadecynyl and n-1-eicosynyl.

Of these, the substituting group $Z^1$ is preferably a halogen atom, a nitro group, a cyano group, or an alkyl group of 1 to 20 carbons which may be substituted with $Z^2$; more preferably a halogen atom or an alkyl group of 1 to 4 carbons which may be substituted with $Z^2$; and most preferably does not exist (i.e., $Ar^1$ to $Ar^3$ are unsubstituted aryl groups).

The substituting group $Z^2$ is preferably a halogen atom, more preferably a fluorine atom, and most preferably does not exist (i.e., is non-substituting).

Specific examples of triarylamine compounds include, but are not limited to, those of formula (5).

[Chemical Formula 7]

(5)

In formula (5), $R^{11}$ to $R^{22}$ are each independently a hydrogen atom, a halogen atom, a nitro group, a cyano group, or an alkyl group of 1 to 20 carbons, alkenyl group of 2 to 20 carbons or alkynyl group of 2 to 20 carbons which may be substituted with $Z^2$. Here, examples of the halogen atoms, alkyl groups, alkenyl groups, alkynyl groups and $Z^2$ include the same as those mentioned above.

$R^{11}$ to $R^{22}$ are preferably hydrogen atoms, halogen atoms, nitro groups, cyano groups, or alkyl groups of 1 to 20 carbons which may be substituted with $Z^2$; more preferably hydrogen atoms, fluorine atoms, or alkyl groups of 1 to 4 carbons which may be substituted with $Z^2$; and most preferably all hydrogen atoms.

Arylaldehyde compounds containing a fluorine atom are not particularly limited, although compounds of formula (2) are preferred.

[Chemical Formula 8]

$$Ar^4-CHO \qquad (2)$$

In formula (2), $Ar^4$ is an aryl group of 6 to 20 carbons which is substituted with at least one $Z^3$ and may also be substituted with $Z^4$. Examples of this aryl group include the same as those mentioned above.

The substituting group $Z^3$ is a fluorine atom, a fluorinated alkyl group of 1 to 20 carbons, or a fluorinated aryl group of 6 to 20 carbons. $Z^4$ is a chlorine atom, a bromine atom, an iodine atom, a nitro group, a cyano group, or an alkyl group of 1 to 20 carbons, alkenyl group of 2 to 20 carbons or alkynyl group of 2 to 20 carbons which may be substituted with $Z^5$. $Z^5$ is a chlorine atom, a bromine atom, an iodine atom, a nitro group or a cyano group.

The fluorinated alkyl group of 1 to 20 carbons and the fluorinated aryl group of 6 to 20 carbons are exemplified by the above-mentioned alkyl groups of 1 to 20 carbons and aryl groups of 6 to 20 carbons in which at least one hydrogen atom on a carbon atom has been substituted with a fluorine atom.

Examples of the alkyl, alkenyl and alkynyl groups include the same as those mentioned above.

Of these, $Z^3$ is preferably a fluorine atom or a fluorinated alkyl group of 1 to 10 carbons, more preferably a fluorine atom or a fluorinated alkyl group of 1 to 4 carbons, and even more preferably a fluorine atom or a perfluoroalkyl group of 1 to 4 carbons.

$Z^4$ is preferably an alkyl group of 1 to 20 carbons which may be substituted with $Z^5$, more preferably an alkyl group of 1 to 10 carbons which may be substituted with $Z^5$, even more preferably an alkyl group of 1 to 4 carbons which may be substituted with $Z^5$, and still more preferably does not exist (i.e., is non-substituting).

$Z^5$ is preferably a chlorine atom or a bromine atom, and more preferably does not exist (i.e., is non-substituting).

Illustrative examples of fluorinated alkyl groups include trifluoromethyl, pentafluoroethyl, 2,2,2-trifluoroethyl, heptafluoropropyl, 2,2,3,3,3-pentafluoropropyl, 2,2,3,3-tetrafluoropropyl, 2,2,2-trifluoro-1-(trifluoromethyl)ethyl, nonafluorobutyl, 4,4,4-trifluorobutyl, undecafluoropentyl, 2,2,3,3,4,4,5,5,5-nonafluoropentyl, 2,2,3,3,4,4,5,5-octafluoropentyl, tridecafluorohexyl, 2,2,3,3,4,4,5,5,6,6,6-undecafluorohexyl, 2,2,3,3,4,4,5,5,6,6-decafluorohexyl and 3,3,4,4,5,5,6,6,6-nonafluorohexyl groups.

Illustrative examples of fluorinated aryl groups include 4-fluorophenyl, 2,3-difluorophenyl, 2,4-difluorophenyl, 2,5-difluorophenyl, 2,6-difluorophenyl, pentafluorophenyl, 1-fluoro-2-naphthyl, 1-fluoro-3-naphthyl, 1-fluoro-4-naphthyl, 1-fluoro-5-naphthyl, 1-fluoro-6-naphthyl, 1-fluoro-7-naphthyl, 1-fluoro-8-naphthyl, 2-fluoro-1-naphthyl, 2-fluoro-3-naphthyl, 2-fluoro-4-naphthyl, 2-fluoro-5-naphthyl, 2-fluoro-6-naphthyl, 2-fluoro-7-naphthyl, 2-fluoro-8-naphthyl and perfluoronaphthyl groups.

Exemplary arylaldehyde compounds include, but are not limited to, compounds of formula (6) or formula (7).

[Chemical Formula 9]

(6)

(7)

In formula (6), $R^{23}$ is a fluorine atom or a fluorinated alkyl group of 1 to 20 carbons, $R^{24}$ to $R^{27}$ are each independently a hydrogen atom, a nitro group, a cyano group or an alkyl group of 1 to 20 carbons which may be substituted with a nitro or cyano group. Examples of these fluorinated alkyl groups and alkyl groups include the same as those mentioned above.

Of these, $R^{23}$ is preferably a fluorine atom or a fluorinated alkyl group of 1 to 10 carbons, more preferably a fluorine atom or a fluorinated alkyl group of 1 to 4 carbons, even more preferably a fluorine atom or a perfluoroalkyl group of 1 to 4 carbons, and still more preferably a fluorine atom or a trifluoromethyl group.

Also, $R^{24}$ to $R^{27}$ are preferably hydrogen atoms or unsubstituted alkyl groups of 1 to 20 carbons, more preferably hydrogen atoms or unsubstituted alkyl groups of 1 to 10 carbons, even more preferably hydrogen atoms or unsubstituted alkyl groups of 1 to 4 carbons, still more preferably hydrogen atoms or methyl groups, and most preferably all hydrogen atoms.

In formula (7), $R^{28}$ to $R^{32}$ are each independently a fluorine atom or a fluorinated alkyl group of 1 to 20 carbons. Examples of this fluorinated alkyl group include the same as those mentioned above.

Of these, $R^{28}$ to $R^{32}$ are preferably fluorine atoms or fluorinated alkyl groups of 1 to 10 carbons, more preferably fluorine atoms or fluorinated alkyl groups of 1 to 4 carbons, even more preferably fluorine atoms or perfluoroalkyl groups of 1 to 4 carbons, still more preferably fluorine atoms or trifluoromethyl groups, and most preferably all fluorine atoms.

In addition, the carbonyl group-bearing fluorene derivative, although not particularly limited, is preferably a compound of formula (3) or formula (4).

[Chemical Formula 10]

(3)

(4)

In formula (3), $R^1$ to $R^8$ are each independently a hydrogen atom, a halogen atom, a nitro group, a cyano group, or an alkyl group of 1 to 20 carbons, alkenyl group of 2 to 20 carbons or alkynyl group of 2 to 20 carbons which may be substituted with $Z^2$. Here, examples of the halogen atom, alkyl group, alkenyl group, alkynyl group and $Z^2$ include the same as those mentioned above.

Of these, $R^1$ to $R^8$ are preferably hydrogen atoms, fluorine atoms or alkyl groups of 1 to 10 carbons which may be substituted with $Z^2$, more preferably hydrogen atoms, fluorine atoms or alkyl groups of 1 to 4 carbons, and most preferably all hydrogen atoms.

Also, in formula (4), $R^1$ to $R^9$ are each independently a hydrogen atom, a halogen atom, a nitro group, a cyano group, or an alkyl group of 1 to 20 carbons, alkenyl group of 2 to 20 carbons or alkynyl group of 2 to 20 carbons which may be substituted with $Z^2$; $R^9$ and $R^{10}$ are each independently a hydrogen atom, an alkyl group of 1 to 20 carbons, (poly)ethylene oxide group of 2 to 20 carbons, alkenyl group of 2 to 20 carbons or alkynyl group of 2 to 20 carbons which may be substituted with $Z^2$, or an alkyl group of 1 to 20 carbons which is substituted with an ethenyl or ethynyl group and may also be substituted with $Z^2$. Here, examples of the halogen atom, alkyl group, alkenyl group, alkynyl group and $Z^2$ include the same as those mentioned above.

Of these, $R^1$ to $R^7$ are preferably hydrogen atoms, fluorine atoms or alkyl groups of 1 to 10 carbons which may be substituted with $Z^2$; more preferably hydrogen atoms, fluorine atoms or alkyl groups of 1 to 4 carbons; and most preferably all hydrogen atoms.

$R^9$ and $R^{10}$ are preferably hydrogen atoms, alkyl groups of 1 to 10 carbons or (poly)ethylene oxide groups of 2 to 10 carbons which may be substituted with $Z^2$; more preferably hydrogen atoms or alkyl groups of 1 to 10 carbons; and most preferably both hydrogen atoms.

The substituting group $Z^2$ is preferably a halogen atom, more preferably a fluorine atom, and most preferably does not exist (i.e., is non-substituting).

The condensation reaction of the triarylamine compound with the arylaldehyde compound and the fluorene derivative may be carried out by condensation polymerization in the presence of an acid catalyst.

In this reaction, the aldehyde compound and the fluorene derivative may be used in a combined amount, per equivalent of aryl groups on the triarylamine compound, of from about 0.01 to about 10 equivalents, although from 0.05 to 5 equivalents is preferred, and from 0.1 to 3 equivalents is more preferred.

In this case, regarding the ratio in which the aldehyde compound and the fluorene derivative are used, the fluorene derivative may generally be used in an amount per equivalent of the aldehyde compound of from about 0.1 to about 20 equivalents, although from 1 to 15 equivalents is preferred, and from 5 to 10 equivalents is more preferred.

Acid catalysts that may be used are exemplified by mineral acids such as sulfuric acid, phosphoric acid and perchloric acid; organic sulfonic acids such as p-toluenesulfonic acid and p-toluenesulfonic acid hydrate; and carboxylic acids such as formic acid and oxalic acid.

The amount of acid catalyst used may be variously selected according to the type thereof, although this is generally from 0.001 to 10 equivalents, preferably from 0.01 to 5 equivalents, and more preferably from 0.1 to 1 equivalent, per equivalent of the triarylamine.

The above condensation reaction may be carried out even in the absence of a solvent, but is generally carried out using a solvent. Any solvent that does not hinder the reaction may be used. Illustrative examples include cyclic ethers such as tetrahydrofuran and 1,4-dioxane; amides such as N,N-dimethylformamide (DMF), N,N-dimethylacetamide (DMAc) and N-methyl-2-pyrrolidone (NMP); ketones such as methyl isobutyl ketone and cyclohexanone; halogenated hydrocarbons such as methylene chloride, chloroform, 1,2-dicloroethane and chlorobenzene; and aromatic hydrocarbons such as benzene, toluene and xylene. These solvents may be used singly, or two or more may be used in admixture. A cyclic ether is especially preferred.

If the acid catalyst used is in the form of a liquid compound such as formic acid, the acid catalyst may also be made to serve as a solvent.

The reaction temperature during condensation is generally from 40 to 200° C. The reaction time is suitably selected according to the reaction temperature, but is generally from about 30 minutes to about 50 hours.

The weight-average molecular weight Mw of the polymer obtained in this way is generally from 500 to 200,000, and preferably from 1,000 to 100,000.

In the charge-transporting varnish of the invention, together with the charge-transporting material containing fluorine atoms that is composed of the above-described polymer, an oligoaniline compound is used as the charge-transporting material not containing fluorine atoms, A hitherto known oligoaniline compounds may be suitably selected and used without particular limitation as the oligoaniline compound. However, in this invention, it is preferable to use an oligoaniline compound of formula (8).

[Chemical Formula 11]

(8)

In formula (8), $R^{33}$ to $R^{38}$ are each independently a hydrogen atom, a halogen atom (exclusive of a fluorine atom), a nitro group, a cyano group, an alkyl group of 1 to 20 carbons, alkenyl group of 2 to 20 carbons or alkynyl group of 2 to 20 carbons which may be substituted with $Z^6$, an aryl group of 6 to 20 carbons or heteroaryl group of 2 to 20 carbons which may be substituted with $Z^7$, —$NHY^2$, —$NHY^3Y^4$, —$C(O)Y^5$, —$OY^6$, —$SY^7$, —$SO_3Y^8$, —$C(O)OY^9$, —$OC(O)Y^{10}$, —$C(O)NHY^{11}$ or —$C(O)NY^{12}Y^{13}$; $Y^2$ to $Y^{13}$ are each independently an alkyl group of 1 to 20 carbons, alkenyl group of 2 to 20 carbons or alkynyl group of 2 to 20 carbons which may be substituted with $Z^6$, or an aryl group of 6 to 20 carbons or heteroaryl group of 2 to 20 carbons which may be substituted with $Z^7$; $X^1$ is —$NY^1$—, —O—, —S—, —$(CR^{39}R^{40})_l$— or a single bond, with $R^{39}$ and $R^{40}$ being the same as defined for $R^{33}$; l is an integer from 1 to 20; $Y^1$ is independently at each occurrence a hydrogen atom, an alkyl group of 1 to 20 carbons, alkenyl group of 2 to 20 carbons or alkynyl group of 2 to 20 carbons which may be substituted with $Z^6$, or an aryl group of 6 to 20 carbons or heteroaryl group of 2 to 20 carbons which may be substituted with $Z^7$; $Z^6$ is a halogen atom (exclusive of a fluorine atom), a nitro group, a cyano group, or an aryl group of 6 to 20 carbons or heteroaryl group of 2 to 20 carbons which may be substituted with $Z^8$; $Z^7$ is a halogen atom (exclusive of a fluorine atom), a nitro group, a cyano group, or an alkyl group of 1 to 20 carbons, alkenyl group of 2 to 20 carbons or alkynyl group of 2 to 20 carbons which may be substituted with $Z^8$; $Z^8$ is a halogen atom (exclusive of a fluorine atom), a nitro group or a cyano group; and m and n are each independently an integer from 1 to 10 and together satisfy the condition m+n≤10.

Examples of the heteroaryl group of 2 to 20 carbons include 2-thienyl, 3-thienyl, 2-furanyl, 3-furanyl, 2-oxazolyl, 4-oxazolyl, 5-oxazolyl, 3-isooxazolyl, 4-isooxazolyl, 5-isooxazolyl, 2-thiazolyl, 4-thiazolyl, 5-thiazolyl, 3-isothiazolyl, 4-isothiazolyl, 5-isothiazolyl, 2-imidazolyl, 4-imidazolyl, 2-pyridyl, 3-pyridyl and 4-pyridyl groups.

In addition, examples of halogen atoms, alkyl groups, alkenyl groups, alkynyl groups and aryl groups include the same as those mentioned above.

In formula (8), $X^1$ is preferably —$NY^1$— or a single bond.

$R^{33}$ to $R^{36}$ are preferably hydrogen atoms, chlorine atoms, bromine atoms, nitro groups, alkyl groups of 1 to 20 carbons which may be substituted with $Z^6$ or aryl groups of 6 to 10 carbons which may be substituted with $Z^7$; more preferably hydrogen atoms or alkyl groups of 1 to 10 carbons; and most preferably all hydrogen atoms.

$R^{37}$ and $R^{38}$ are preferably hydrogen atoms, chlorine atoms, bromine atoms, nitro groups, alkyl groups of 1 to 20 carbons which may be substituted with $Z^6$, aryl groups of 6 to 10 carbons which may be substituted with $Z^7$, or —$NY^3Y^4$ groups which are aryl groups of 6 to 20 carbons wherein $Y^3$ and $Y^4$ may be substituted with $Z^7$; more preferably hydrogen atoms or diarylamino groups of 12 to 24 carbons; and even more preferably both hydrogen atoms or diphenylamino groups.

$R^{39}$ and $R^{40}$ are preferably hydrogen atoms, alkyl groups of 1 to 20 carbons which may be substituted with $Z^6$, or aryl groups of 6 to 10 carbons which may be substituted with $Z^7$; more preferably hydrogen atoms or alkyl groups of 1 to 10 carbons; and most preferably both hydrogen atoms.

$Y^1$ is preferably a hydrogen atom or an alkyl group of 1 to 20 carbons which may be substituted with $Z^6$; more preferably a hydrogen atom or a methyl group; and most preferably a hydrogen atom. Also, a plurality of $Y^1$ occurrences may mutually differ or may all be the same.

In particular, a combination in which $R^{33}$ to $R^{36}$ are hydrogen atoms or alkyl groups of 1 to 10 carbons, $R^{37}$ and $R^{38}$ are hydrogen atoms or diarylamino groups of 12 to 24 carbons, $X^1$ is —$NY^1$— or a single bond, and $Y^1$ is a hydrogen atom or a methyl group is preferred; and a combination in which $R^{33}$ to $R^{36}$ are all hydrogen atoms, $R^{37}$ and $R^{38}$ are both hydrogen atoms or diphenylamino groups, $X^1$ is —$NY^1$— or a single bond, and $Y^1$ is a hydrogen atom is more preferred.

In $Y^1$ to $Y^{13}$ and $R^{33}$ to $R^{40}$, the substituting group $Z^6$ is preferably a chlorine atom, a bromine atom, a nitro group, a cyano group or an aryl group of 6 to 20 carbons which may be substituted with $Z^8$; more preferably a chlorine atom, a bromine atom or a phenyl group which may be substituted with $Z^8$; and most preferably does not exist (i.e., is non-substituting).

The substituting group $Z^7$ is preferably a chlorine atom, a bromine atom, a nitro group, a cyano group, an alkyl group of 1 to 20 carbons which may be substituted with $Z^8$; more preferably a chlorine atom, a bromine atom or an alkyl group of 1 to 4 carbons which may be substituted with $Z^8$; and most preferably does not exist (i.e., is non-substituting).

$Z^6$ is preferably a chlorine atom or a bromine atom, and most preferably does not exist (i.e., is non-substituting).

In formula (8), m and n are each independently an integer from 1 to 10 and together satisfy the condition m+n≤10. However, taking into account the balance of the charge-transportability of the resulting thin-film and the solubility of the oligoaniline compound, m and n preferably satisfy the condition 2≤m+n≤8, more preferably satisfy the condition 2≤m+n≤6, and even more preferably satisfy the condition 2≤m+n≤4.

The molecular weight of the oligoaniline compound that does not contain fluorine atoms is generally from 300 to 5,000. However, from the standpoint of increasing the solubility, this is preferably not more than 4,000, more preferably not more than 3,000, and even more preferably not more than 2,000.

The method of preparing the oligoaniline compound used in this invention is not particularly limited and is exemplified by the methods described in *Bulletin of Chemical Society of Japan*, Vol. 67, pp. 1749-1752 (1994); *Synthetic Metals*, Vol. 84, pp. 119-120 (1997); and International Disclosures WO 2008/032617, 2008/032616 and 2008/129947.

Examples of the oligoaniline compounds of formula (8) include, but are not limited to, those of the following formulas.

[Chemical Formula 12]

(a)

(b)

(c)

(d)

(e)

(f)

(g)

(h)

(i)

[Chemical Formula 13]

(j)

(k)

(I)

In the charge-transporting varnish of the invention, the ratio in which the charge-transporting material containing fluorine atoms and the charge-transporting material not containing fluorine atoms are used is not particularly limited. However, to further increase the brightness characteristics and durability of the organic EL device obtained, the mass ratio of the charge-transporting material containing fluorine atoms relative to unity (1) for the charge-transporting material not containing fluorine atoms is preferably set to from about 0.1 to about 5, more preferably from about 0.5 to about 3, and even more preferably from about 0.5 to about 1.

In addition, the charge-transporting varnish of the invention includes a heteropolyacid compound as the dopant material.

Figure 1:
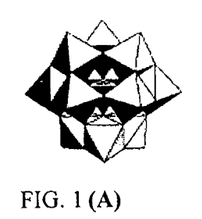
FIG. 1(A) refers to the Keggin-type chemical structure.
FIG. 1(B) refers to the Dawson-type chemical structure.

"Heteropolyacid" refers to a polyacid having a structure in which a heteroatom is positioned at the center of the molecule—typically of the Keggin-type chemical structure shown in Chemical Formula 14 (see FIG. 1(A)) or the Dawson-type chemical structure shown in Chemical Formula 14 (see FIG. 1(B)), and which is obtained by the condensation of an isopolyacid which is an oxo acid of vanadium (V), molybdenum (Mo), tungsten (W) or the like with an oxo acid of a different element. Examples of this oxo acid of another element include primarily oxo acids of silicon (Si), phosphorus (P) and arsenic (As).

[Chemical Formula 14]

Chemical Formula 14 is shown in FIG. 1(A) and FIG. 1(B) of the drawings.

Illustrative examples of heteropolyacids include phosphomolybdic acid, silicomolybdic acid, phosphotungstic acid, silicotungstic acid and phosphotungstomolybdic acid. These may be used singly, or two or more may be used in combination. The heteropolyacid compound used in this invention may be acquired as a commercial product or may be synthesized by a known method.

In the invention, to enhance the brightness characteristics of the organic EL device, phosphomolybdic acid or phosphotungstic acid is preferred. Phosphotungstic acid is more preferred.

Even a heteropolyacid for which, in quantitative analysis such as elemental analysis, the number of elements as determined from the structure shown in the general formula is high or low may be used in this invention, provided it was acquired as a commercial product or was suitably synthesized in accordance with a known method of synthesis.

Thus, for example, phosphotungstic acid is generally represented by the chemical formula $H_3(PW_{12}O_{40}) \cdot nH_2O$ and phosphomolybdic acid is generally represented by the chemical formula $H_3(PMo_{12}O_{40}) \cdot nH_2O$. In quantitative analysis, regardless of whether the number of the elements P (phosphorus), O (oxygen) and W (tungsten) or Mo (molybdenum) within these formulas is high or low, so long as the heteropolyacid was acquired as a commercial product or suitably synthesized by a known method of synthesis, it may be used in this invention. In such cases, the mass of the heteropolyacid specified in this invention refers not to the mass of, for example, pure phosphotungstic acid (phosphotungstic acid content) within the product of synthesis or the commercial product, but rather, in the form available as a commercial product or the form that can be isolated by a known method of synthesis, to the total mass in a state that includes water of hydration and other impurities.

In the practice of this invention, by setting the heteropolyacid, and preferably phosphotungstic acid, to a mass ratio relative to unity (1) for the oligoaniline compound of from about 2 to about 10, and preferably from about 2.5 to about 9.0, a charge-transporting thin-film that imparts a high brightness when used in organic EL devices can be reproducibly obtained.

That is, in such charge-transporting varnishes, the ratio of the mass of heteropolyacid ($W_D$) to the mass of oligoaniline compound ($W_H$) satisfies the relationship $2 \leq W_D/W_H \leq 10$, and preferably satisfies the relationship $2.5 \leq W_D/W_H \leq 9.0$.

The charge-transporting varnish of the invention may include a curing agent for the purpose of improving the solvent resistance of thin-films obtained from the varnish.

Such a curing agent is not particularly limited and is exemplified by various hitherto known curing agents, such as (meth)acrylate compounds, epoxy compounds, and compounds having blocked isocyanate groups, with acrylate curing agents such as (meth)acrylate compounds and compositions containing the same being preferred, and polyacrylate curing agents such as poly(meth)acrylate compounds and compositions containing the same being more preferred.

Illustrative examples of acrylate curing agents include hexanediol di(meth)acrylate, neopentyl glycol di(meth)acrylate, triethylene glycol di(meth)acrylate, polyethylene glycol di(meth)acrylate, polypropylene glycol di(meth)acrylate, pentaerythritol di(meth)acrylate monostearate, bisphenol A-ethylene glycol adduct (meth)acrylate, bisphenol F-ethylene glycol adduct (meth)acrylate, tricyclo[$5.2.1.0^{2,6}$]decanemethanol di(meth)acrylate, tris(hydroxyethyl) isocyanurate di(meth)acrylate, trimethylolpropane tri(meth)acrylate, trimethylolpropane-ethylene glycol adduct tri(meth)acrylate, trimethylolpropane-propylene glycol adduct tri(meth)acrylate, pentaerythritol tri(meth)acrylate, tris(meth)acryloyloxyethyl phosphate, tris(hydroxyethyl) isocyanurate tri(meth)acrylate, modified ε-caprolactone tri(meth)acrylate, trimethylolpropane ethoxytri(meth)acrylate, glycerol-propylene glycol adduct tris(meth)acrylate, pentaerythritol tetra(meth)acrylate, pentaerythritol-ethylene glycol adduct tetra(meth)acrylate, ditrimethylolpropane tetra(meth)acrylate, dipentaerythritol hexapenta(meth)acrylate, dipentaerythritol monohydroxypenta(meth)acrylate, urethane (meth)acrylate, epoxy (meth)acrylate, polyester (meth)acrylate, unsaturated polyester, 9,9-bis[4-(2-acryloyloxyethoxy)phenyl]fluorene, Ogsol EA-0200, EA-F5003, EA-F5503 and EA-F5510 (all from Osaka Gas Chemicals Co., Ltd.), and NK Ester A-BPEF and A-BPEF/PGMAC70 (both from Shin-Nakamura Chemical Co., Ltd.).

When a curing agent is used, it may be used in any amount, provided the target solvent resistance is imparted to the resulting thin-film and the curing agent does not adversely affect inherent characteristics of the thin-film, such as charge transportability. The amount of use, expressed as a mass ratio with respect to a combined mass of 1 for the charge-transporting material having fluorine atoms, the charge-transporting material having no fluorine atoms and the dopant material composed of heteropolyacid, is preferably from about 0.01 to about 10, more preferably from about 0.05 to about 5.0, and even more preferably from about 0.10 to about 2.0.

The solvent used when preparing the charge-transporting varnish may be a high-solvency solvent which is capable of dissolving well the charge-transporting material and the dopant material. Illustrative examples of such high-solvency solvents that may be used include organic solvents such as N,N-dimethylformamide, N,N-dimethylacetamide, N-methylpyrrolidone, 1,3-dimethyl-2-imidazolidinone and diethylene glycol monomethyl ether. These solvents may be used singly, or two or more may be used in admixture. The amount of use may be set to from 5 to 100 wt % of the overall solvent used in the varnish.

It is preferable for both the charge-transporting material and the dopant material to be either completely dissolved or in a uniformly dispersed state within the solvent.

In addition, at least one high-viscosity organic solvent having a viscosity at 25° C. of from 10 to 200 mPa·s, and especially 35 to 150 mPa·s, and having a boiling point at standard pressure (atmospheric pressure) of from 50 to 300° C., and especially from 150 to 250° C., may be included in the charge-transporting varnish of the invention. By doing so, adjusting the viscosity of the varnish is easy, as a result of which the preparation of a varnish that reproducibly gives thin-films of high flatness and accords with the coating method to be used is possible.

Illustrative examples of high-viscosity organic solvents include, but are not particularly limited to, cyclohexanol, ethylene glycol, 1,3-octylene glycol, diethylene glycol, dipropylene glycol, triethylene glycol, tripropylene glycol, 1,3-butanediol, 2,3-butanediol, 1,4-butanediol, propylene glycol and hexylene glycol. These solvents may be used singly, or two or more may be used in admixture.

The amount of high-viscosity organic solvent added as a proportion of the overall solvent used in the varnish of the invention is preferably within a range where no precipitation of solids occurs. To the extent that solids do not precipitate, the amount of such addition is preferably from 5 to 80 wt %.

In addition, another solvent may be admixed in a proportion with respect to the overall solvent used in the varnish of from 1 to 90 wt %, and preferably 1 to 50 wt %, for such purposes as to enhance the substrate wettability, adjust the solvent surface tension, adjust the solvent polarity and adjust the solvent boiling point.

Examples of such solvents include, but are not limited to, ethylene glycol monobutyl ether, diethylene glycol diethyl ether, diethylene glycol dimethyl ether, diethylene glycol monoethyl ether acetate, diethylene glycol monobutyl ether acetate, dipropylene glycol monomethyl ether, propylene glycol monomethyl ether, propylene glycol monomethyl ether acetate, diethylene glycol monoethyl ether, diacetone alcohol, γ-butyrolactone, ethyl lactate and n-hexyl acetate. These solvents may be used singly, or two or more may be used in admixture.

The viscosity of the inventive varnish is suitably set according to the thickness and other properties of the thin-film to be produced and the solids concentration of the varnish, and is generally from 1 to 50 mPa·s at 25° C.

The solids concentration of the charge-transporting varnish in this invention is suitably set while taking into account the viscosity, surface tension and other properties of the varnish and the thickness and other properties of the thin-film to be produced, and is generally from about 0.1 wt % to about 10.0 wt %. Based on such considerations as improving the coating properties of the varnish, the solids concentration of the varnish is preferably from 0.5 to 5.0 wt %, and more preferably from 1.0 to 3.0 wt %.

By coating the above-described charge-transporting varnish onto a substrate and baking, a charge-transporting thin-film can be formed on the substrate.

Examples of the varnish coating method include, but are not particularly limited to, dipping, spin coating, slit coating, transfer printing, roll coating, brush coating, inkjet printing and spraying. It is preferable to adjust the viscosity and surface tension of the varnish according to the coating method to be used.

When using the varnish of the invention, the baking atmosphere is not particularly limited. A thin-film having a uniform film surface and high charge transportability can be obtained not only in an open-air atmosphere, but even in an inert gas such as nitrogen or in a vacuum.

The baking temperature is suitably set in a range of generally from 100 to 260° C. while taking into consideration such factors as the intended use of the resulting thin-film and the degree of charge transportability to be imparted to the resulting thin-film. In cases where the resulting thin-film is to be used as a functional single film (hole injection/transport layer) situated between the positive electrode and the emissive layer of an organic EL device and in a form that contacts both, the baking temperature is preferably from about 140 to about 250° C., and more preferably from about 150 to about 230° C. In this case, a temperature change in two or more steps may be applied for such purposes as to manifest a more uniform film formability or to induce the reaction to proceed on the substrate. Heating may be carried out using a suitable apparatus such as a hot plate or an oven.

The thickness of the charge-transporting thin-film is not particularly limited; when used in an organic EL device, the film thickness may be set to from about 5 to about 200 nm. However, from the standpoint of increasing phase separation of the two types of charge-transporting materials used in the invention and further increasing the brightness characteristics and life of the organic EL device, the film thickness is preferably from 10 to 100 nm, more preferably from 20 to 50 nm, and even more preferably from 25 to 45 nm.

Methods of varying the film thickness include, for example, varying the solids concentration in the varnish, and varying the amount of solution on the substrate during coating.

Examples of the materials and method used to fabricate organic light-emitting diode (OLED) devices using the charge-transporting varnish of the invention include, but are not limited to, those mentioned below.

The electrode substrate to be used is preferably cleaned by carrying out liquid washing beforehand with a cleaning agent, alcohol, pure water or the like. For example, in the case of a positive electrode substrate, it is preferable to carry out surface treatment such as UV/ozone treatment or oxygen-plasma treatment just prior to use. However, in cases where the positive electrode material is composed primarily of organic substances, surface treatment need not be carried out.

An example of a method of manufacturing an OLED device having a functional single film (hole injection/transport layer) composed of a thin-film obtained from the charge-transporting varnish of the invention is described below.

A functional single film is formed on an electrode by coating the charge-transporting varnish of the invention onto a positive electrode substrate and baking by the above method. This film is then introduced into a vacuum deposition system, where an emissive layer, electron transport layer, electron injection layer and negative electrode metal are vapor-deposited in this order to form the OLED device. Carrier block layers may be provided to desired layer intervals so as to control the light-emitting region.

Illustrative examples of the positive electrode material include transparent electrodes such as indium-tin oxide (ITO) and indium-zinc oxide (IZO). A positive electrode material on which planarizing treatment has been carried out is preferred. Use can also be made of polythiophene derivatives and polyaniline derivatives having a high charge transportability.

Illustrative examples of the emissive layer-forming material include tris(8-quinolinolate) aluminum(III) (Alq$_3$), bis (8-quinolinolate) zinc(II) (Znq$_2$), bis(2-methyl-8-quinolinolate)(p-phenylphenolate) aluminum(III) (BAlq) and 4,4'-bis (2,2-diphenylvinyl)biphenyl (DPVBi). It is also possible to form the emissive layer by the co-vapor deposition of an electron-transporting material or hole-transporting material with a light-emitting dopant.

Illustrative examples of the electron-transporting material include Alq$_3$, BAlq, DPVBi, (2-(4-biphenyl)-5-(4-t-butylphenyl)-1,3,4-oxadiazole) (PBD), triazole derivatives (TAZ), bathocuproin (BCP) and silole derivatives.

Illustrative examples of light-emitting dopants include quinacridone, rubrene, coumarin 540, 4-(dicyanomethylene)-2-methyl-6-(p-dimethylaminostyryl)-4H-pyran (DCM), tris(2-phenylpyridine) iridium(III) (Ir(ppy)$_3$) and (1,10-phenanthroline)tris(4,4,4-trifluoro-1-(2-thienyl)butane-1,3-dionate) europium(III) (Eu(TTA)$_3$phen).

Illustrative examples of the carrier block layer-forming material include PBD, TAZ and BCP.

Illustrative examples of the electron injection layer-forming material include lithium oxide (Lip), magnesium oxide (MgO), alumina (Al$_2$O$_3$), lithium fluoride (LiF), magnesium fluoride (MgF$_2$), strontium fluoride (SrF$_2$), Liq, Li(acac), lithium acetate and lithium benzoate.

Illustrative examples of the negative electrode material include aluminum, magnesium-silver alloys, aluminum-lithium alloys, lithium, sodium, potassium and cesium.

The method of fabricating polymer LED (PLED) devices using the charge-transporting varnish of the invention, although not particularly limited, is exemplified by the following method.

A PLED device having a functional single film (hole injection/transport layer) composed of the thin-film obtained from the charge-transporting varnish of the invention can be fabricated by, in the fabrication of an OLED device as described above, forming a light-emitting polymer layer instead of carrying out vacuum deposition operations for an emissive layer, electron transport layer and electron injection layer.

Specifically, the charge-transporting varnish of the invention is coated onto a positive electrode substrate and a functional single film is produced by the above-described method. A light-emitting polymer layer is formed on top thereof, in addition to which a negative electrode is vapor-deposited, thereby forming the PLED device.

The negative electrode and positive electrode materials used here may be similar to those used when fabricating an OLED device as described above, and similar cleaning treatment and surface treatment may be carried out.

The method of forming the light-emitting polymer layer is exemplified by a film-forming method in which a light-emitting polymer material, or a material obtained by adding thereto a dopant material, is dissolved or uniformly dispersed by the addition of a solvent, following which the resulting solution or dispersion is coated onto the functional single film and is subsequently baked.

Illustrative examples of light-emitting polymer materials include polyfluorene derivatives such as poly(9,9-dialkylfluorene) (PDAF), poly(phenylene vinylene) derivatives such as poly(2-methoxy-5-(2'-ethylhexoxy)-1,4-phenylenevinylene) (MEH-PPV), polythiophene derivatives such as poly(3-alkylthiophene) (PAT), and polyvinylcarbazole (PVCz).

Illustrative examples of the solvent include toluene, xylene and chloroform. Examples of the method of dissolution or uniform dispersion include stirring, stirring under applied heat, and ultrasonic dispersion.

Examples of the coating method include, but are not particularly limited to, inkjet printing, spraying, dipping, spin coating, transfer printing, roll coating and brush coating. Coating is preferably carried out in an inert gas atmosphere such as nitrogen or argon.

Examples of the baking method include methods that involve heating in an oven or on a hot plate and within an inert gas atmosphere or in a vacuum.

EXAMPLES

Synthesis Examples, Examples and Comparative Examples are given below to more concretely illustrate the invention, although the invention is not limited by these Examples. The equipment used was as follows.
(1) Substrate Cleaning: Substrate cleaning machine (reduced-pressure plasma system), from Choshu Industry Co., Ltd.
(2) Varnish Coating: MS-A100 Spin Coater, from Mikasa Co., Ltd.
(3) Film Thickness Measurement:
   Surfcorder ET-4000 microfigure measuring instrument, from Kosaka Laboratory, Ltd.
(4) Polymer Molecular Weight Measurement:
   Shimadzu Corporation system (columns: SHODEX GPC KF-803L+GPC KF-804L; column temperature, 40° C.; detectors, UV detector (254 nm) and RI detector; eluant, THF; column flow rate, 1.0 mL/min)
(5) EL Device Fabrication: C-E2L1G1-N Multifunction Vapor Deposition System, from Choshu Industry Co., Ltd.
(6) Measurement of EL Device Brightness, etc.:
   I-V-L Measurement System from Tech World, Inc.

[1] Synthesis of Charge-Transporting Material Containing Fluorine Atoms

[Synthesis Example 1] Synthesis of Polymer 1

[Chemical Formula 15]

Polymer 1

The solution obtained by adding 10.0 g (40.76 mmol) of triphenylamine, 0.44 g (2.44 mmol) of pentafluorobenzaldehyde, 7.68 g (42.80 mmol) of 9-fluorenone and 1.62 g (8.15 mmol) of p-toluenesulfonic acid to 20 g of 1,4-dioxane was raised to a temperature of 110° C. and stirred in this state for 4 hours, then cooled to room temperature. After cooling, the solution was diluted by adding 10 g of tetrahydrofuran (THF), the diluted solution was added dropwise to 500 mL methanol/100 mL 28% ammonia water, and the resulting mixture was stirred for 30 minutes. The powder that precipitated out was recovered by suction filtration and dissolved in 40 mL of THF. This solution was added dropwise to 500 mL of methanol and stirred for 30 minutes. The precipitated powder was recovered by suction filtration and vacuum dried, giving Polymer 1 (3.8 g).

Mw (GPC): 1,800
IR (cm$^{-1}$): 1587, 1505, 1323, 1274, 1178, 1111, 1074, 993, 965, 750, 694, 632

[Synthesis Example 2] Synthesis of Polymer 2

[Chemical Formula 16]

Polymer 2

The solution obtained by adding 10.0 g (40.76 mmol) of triphenylamine, 0.78 g (4.48 mmol) of pentafluorobenzaldehyde, 7.27 g (40.35 mmol) of 9-fluorenone and 1.62 g (8.15 mmol) of p-toluenesulfonic acid to 20 g of 1,4-dioxane was raised to a temperature of 110° C. and stirred in this state for 3 hours, then cooled to room temperature. After cooling, the solution was diluted by adding 10 g of tetrahydrofuran (THF), the diluted solution was added dropwise to 500 mL methanol/100 mL 28% ammonia water, and the resulting mixture was stirred for 30 minutes. The powder that precipitated out was recovered by suction filtration and dissolved in 40 mL of THF. This solution was added dropwise to 500 mL of methanol and stirred for 30 minutes. The precipitated powder was recovered by suction filtration and vacuum dried, giving Polymer 2 (4.5 g).

Mw (GPC): 1,900
IR (cm$^{-1}$): 1587, 1504, 1488, 1324, 1272, 1162, 1122, 1067, 1016, 819, 750, 692, 620

[2] Synthesis of Charge-Transporting Material not Containing Fluorine Atoms

[Synthesis Example 3] Synthesis of Oligoaniline Compound 1

[Chemical Formula 17]

Oligoaniline Compound 1

Tetrakis(triphenylphosphine)palladium (0.5799 g, 0.5018 mmol) and 10.13 g (105.40 mmol) of sodium tert-butoxide were added to a mixed suspension of 10.00 g (50.19 mmol) of 4,4'-diaminodiphenylamine, 34.17 g (105.40 mmol) of 4-bromotriphenylamine and 100 g of xylene, and the mixture was stirred under nitrogen at 130° C. for 14 hours.

Next, the reaction mixture was filtered, saturated saline was added to the filtrate and liquid-liquid extraction was carried out, following which solvent was driven off by distillation from the organic phase. The solid thus obtained was recrystallized from 1,4-dioxane, giving the target Oligoaniline Compound 1 in an amount of 22.37 g (yield, 65%).

$^1$H-NMR (CDCl$_3$): δ 7.83 (S, 2H), 7.68 (S, 1H), 7.26-7.20 (m, 8H), 7.01-6.89 (m, 28H).

[3] Preparation of Charge-Transporting Varnish

[Example 1] Charge-Transporting Varnish A 1,3-Dimethylimidazolidinone (3 g) was added, within a glove box with nitrogen circulation, to a mixture of Polymer 1 (139 mg) obtained in Synthesis Example 1, Oligoaniline Compound 1 (31 mg) obtained in Synthesis Example 3 and phosphotungstic acid (155 mg; Kanto Chemical Co.), and dissolved by stirring under applied heat at 50° C. Cyclohexanol (3 g) was added to this solution and stirring was carried out, giving a green-colored solution. This solution was filtered with a syringe filter having a pore size of 0.2 μm, giving Charge-Transporting Varnish A.

[Example 2] Charge-Transporting Varnish B

Aside from changing the amounts in which Polymer 1, Oligoaniline Compound 1 and phosphotungstic acid were used to 154 mg, 26 mg and 128 mg, respectively, a charge-transporting varnish was prepared by the same method as in Example 1.

[Example 3] Charge-Transporting Varnish C

Aside from using 139 mg of Polymer 2 obtained in Synthesis Example 2 instead of 139 mg of Polymer 1, a charge-transporting varnish was prepared by the same method as in Example 1.

[Example 4] Charge-Transporting Varnish D

Aside from using 154 mg of Polymer 2 obtained in Synthesis Example 2 instead of 154 mg of Polymer 1, a charge-transporting varnish was prepared by the same method as in Example 2.

[Comparative Example 1] Charge-Transporting Varnish E

Aside from not using Polymer 1 and setting the amounts in which Oligoaniline Compound 1 and phosphotungstic acid were used to 64 mg and 319 mg, respectively, a charge-transporting varnish was prepared by the same method as in Example 1.

[Example 9] Charge-Transporting Varnish F

Dipropylene glycol (1.2 g) was added, within a glove box with nitrogen circulation, to a mixture of Polymer 2 (139 mg) obtained in Synthesis Example 2, Oligoaniline Compound 1 (31 mg) obtained in Synthesis Example 3 and phosphotungstic acid (155 mg; Kanto Chemical Co.), and dissolved by stirring under applied heat at 50° C. Diethylene glycol monoethyl ether acetate (4.8 g) was added to this solution and stirring was carried out, giving a green-colored solution. This solution was filtered with a syringe filter having a pore size of 0.2 μm, giving Charge-Transporting Varnish F.

[Example 10] Charge-Transporting Varnish G

Aside from preparing a mixture by the further addition of the curing agent Ogsol EA-F5003 (111 mg), Charge-Transporting Varnish G was prepared by the same method as in Example 9.

[4] Fabrication of Organic EL Devices (OLED Devices) and Evaluation of their Characteristics A 25 mm×25 mm×0.7 mm (t) glass substrate with indium-tin oxide patterned on the surface thereof to a film thickness of 150 nm (abbreviated below as a "ITO substrate") was used as the substrate during evaluation of the electric characteristics. The ITO substrate was used after removing impurities on the surface with an O$_2$ plasma cleaning system (150 W, 30 seconds).

[Example 5] Fabrication of OLED Devices Using Charge-Transporting Varnish A

Charge-Transporting Varnish A obtained in Example 1 was coated onto an ITO substrate using a spin coater, then dried at 50° C. for 5 minutes and baked at 230° C. for 15 minutes, thereby forming a uniform 30 nm thin-film on the ITO substrate.

Next, using a vapor deposition system (degree of vacuum, 1.0×10$^{-5}$ Pa), thin-films of tris(8-quinolate)aluminum(III) (Alq$_3$), lithium fluoride and aluminum were successively deposited on the ITO substrate on which the thin-film had been formed, thereby giving an OLED device. Vapor deposition was carried out at a rate of 0.2 nm/s for Alq$_3$ and aluminum, and at a rate of 0.02 nm/s for lithium fluoride. The film thicknesses were set to, respectively, 40 nm, 0.5 nm and 100 nm.

To prevent the device characteristics from deteriorating due to the influence of oxygen, moisture and the like in air, the OLED device was sealed with sealing substrates, following which the characteristics were evaluated. Sealing was carried out by the following procedure.

The organic EL device was placed between sealing substrates in a nitrogen atmosphere having an oxygen concentration of 2 ppm or less and a dew point of not more than −85° C., and the sealing substrates were laminated together using an adhesive (XNR5516Z-B1, from Nagase ChemteX Corporation). At this time, a desiccant (HD-071010W-40, from Dynic Corporation) was placed, together with the OLED device, within the sealing substrates.

The laminated sealing substrates were irradiated with UV light (wavelength, 365 nm; dosage, 6,000 mJ/cm$^2$), then annealed at 80° C. for 1 hour to cure the adhesive.

[Example 6] Fabrication of OLED Device Using Charge-Transporting Varnish B

Aside from using Charge-Transporting Varnish B obtained in Example 2 instead of Charge-Transporting Varnish A, an OLED device was fabricated by the same method as in Example 5.

[Example 7] Fabrication of OLED Device Using Charge-Transporting Varnish C

Aside from using Charge-Transporting Varnish C obtained in Example 3 instead of Charge-Transporting Varnish A, an OLED device was fabricated by the same method as in Example 5.

[Example 8] Fabrication of OLED Device Using Charge-Transporting Varnish D

Aside from using Charge-Transporting Varnish D obtained in Example 4 instead of Charge-Transporting Varnish A, an OLED device was fabricated by the same method as in Example 5.

[Comparative Example 2] Fabrication of OLED Device Using Charge-Transporting Varnish E Aside from using Charge-Transporting Varnish E obtained in Comparative Example 1 instead of Charge-Transporting Varnish A, an OLED device was fabricated by the same method as in Example 5.

[Example 11] Fabrication of OLED Device Using Charge-Transporting Varnish F

Aside from using Charge-Transporting Varnish F obtained in Example 9 instead of Charge-Transporting Varnish A, an OLED device was fabricated by the same method as in Example 5.

[Example 12] Fabrication of OLED Device Using Charge-Transporting Varnish G

Aside from using Charge-Transporting Varnish G obtained in Example 10 instead of Charge-Transporting Varnish A, an OLED device was fabricated by the same method as in Example 5.

The electrical characteristics of the OLED devices obtained in Examples 5 to 8, 11 and 12 and Comparative Example 2 were measured twice using a current-voltage-luminance measurement system. The current densities, brightnesses and current efficiencies at a driving voltage of 7 V during each measurement are shown in Table 1.

As shown in Table 1, it is apparent that in Comparative Example 2 using Charge-Transporting Varnish E to which neither Polymer 1 nor Polymer 2 was added, the current efficiency was very low and the brightness was low for the current density.

Also, in Examples 5 to 8, 11 and 12 in which Polymer 1 or Polymer 2 was added, the characteristics in the first measurement and the second measurement remained substantially unchanged, whereas the brightness decreased to about one-half in Comparative Example 2. This fact indicates that the OLED device in Comparative Example 2 has a short life, and that the OLED devices in Examples 5 to 8, 11 and 12 have long lives.

It is thus apparent that by adding Polymer 1 or Polymer 2 to a charge-transporting varnish, the current efficiency of the OLED device can be improved, in addition to which the life of the device can be increased.

[5] Evaluation of Thin-Film Toluene Resistance

[Example 13] Evaluation of Toluene Resistance of Thin-Film Fabricated from Charge-Transporting Varnish F The charge-transporting varnish F obtained in Example 9 was coated onto an ITO substrate using a spin coater, then dried at 100° C. for 1 minute and baked at 230° C. for 15 minutes, thereby forming a uniform 30 nm thin-film on the ITO substrate. Next, 0.5 mL of toluene was placed on this substrate and left to stand for 1 minute, after which the toluene was removed by spin coating and the thin-film was dried at 120° C. for 1 minute. The film thickness was then measured with a stylus-type film thickness meter and the residual film ratio was calculated by comparison with the film thickness prior to stripping with toluene.

[Example 14] Evaluation of Toluene Resistance of Thin-Film Fabricated from Charge-Transporting Varnish G Aside from using Charge-Transporting Varnish G obtained in Example 10 instead of Charge-Transporting Varnish F, the residual film ratio was calculated by the same method as in Example 13.

TABLE 1

| | First measurement | | | Second measurement | | |
|---|---|---|---|---|---|---|
| | Current density ($mA/cm^2$) | Brightness ($cd/m^2$) | Current efficiency (cd/A) | Current density ($mA/cm^2$) | Brightness ($cd/m^2$) | Current efficiency (cd/A) |
| Example 5 | 60 | 922 | 1.5 | 57 | 845 | 1.5 |
| Example 6 | 26 | 393 | 1.5 | 25 | 359 | 1.5 |
| Example 7 | 128 | 1,785 | 1.4 | 127 | 1,750 | 1.4 |
| Example 8 | 72 | 825 | 1.1 | 72 | 820 | 1.1 |
| Comparative Example 2 | 2,320 | 1,345 | 0.1 | 2,075 | 739 | 0.0 |
| Example 11 | 81 | 1,075 | 1.3 | 74 | 994 | 1.3 |
| Example 12 | 78 | 1,109 | 1.4 | 70 | 921 | 1.3 |

TABLE 2

| | Residual film ratio ((film thickness after toluene stripping/film thickness before toluene stripping) × 100) |
|---|---|
| Example 13 | 49% |
| Example 14 | 95% |

As shown in Table 2, a thin-film having excellent toluene resistance can be obtained by using a varnish to which a curing agent has been added.

From the results in Examples 11 to 14, it is apparent that, by adding a curing agent, the toluene resistance of the film can be enhanced without changing the OLED characteristics. This suggests that, even in cases where an emissive layer is formed using toluene or the like, organic EL devices of high durability can be reproducibly manufactured.

The invention claimed is:

1. A charge-transporting varnish characterized by comprising a charge-transporting material containing fluorine atoms, a charge-transporting material not containing fluorine atoms, a dopant material composed of a heteropolyacid, and an organic solvent,
wherein the charge-transporting material containing fluorine atoms is a polymer having a weight-average molecular weight of from 1,000 to 200,000 which is obtained by condensation of a triarylamine compound, a fluorine atom-containing arylaldehyde compound, and a carbonyl group-bearing fluorene derivative, and
the charge-transporting material not containing fluorine atoms is an oligoaniline compound.

2. The charge-transporting varnish according to claim 1, wherein the charge-transporting material containing fluorine atoms is a polymer obtained by condensation of a triarylamine compound of formula (1), a fluorine atom-containing arylaldehyde compound of formula (2), and a carbonyl group-bearing fluorene derivative of formula (3) or formula (4)

(wherein $Ar^1$ to $Ar^3$ are each independently an aryl group of 6 to 20 carbons which may be substituted with $Z^1$, with at least one constituent carbon atom in each aryl group being unsubstituted;

$Ar^4$ is an aryl group of 6 to 20 carbons which is substituted with at least one $Z^3$ and may also be substituted with $Z^4$;

$R^1$ to $R^8$ are each independently a hydrogen atom, a halogen atom, a nitro group, a cyano group, or an alkyl group of 1 to 20 carbons, alkenyl group of 2 to 20 carbons or alkynyl group of 2 to 20 carbons which may be substituted with $Z^2$;

$R^9$ and $R^{10}$ are each independently a hydrogen atom, an alkyl group of 1 to 20 carbons, (poly)ethylene oxide group of 2 to 20 carbons, alkenyl group of 2 to 20 carbons or alkynyl group of 2 to 20 carbons which may be substituted with $Z^2$, or an alkyl group of 1 to 20 carbons which is substituted with an ethenyl or ethynyl group and may also be substituted with $Z^2$;

$Z^1$ is a halogen atom, a nitro group, a cyano group, or an alkyl group of 1 to 20 carbons, alkenyl group of 2 to 20 carbons or alkynyl group of 2 to 20 carbons which may be substituted with $Z^2$;

$Z^2$ is a halogen atom, a nitro group or a cyano group;

$Z^3$ is a fluorine atom, a fluorinated alkyl group of 1 to 20 carbons, or a fluorinated aryl group of 6 to 20 carbons;

$Z^4$ is a chlorine atom, a bromine atom, an iodine atom, a nitro group, a cyano group, or an alkyl group of 1 to 20 carbons, alkenyl group of 2 to 20 carbons or alkynyl group of 2 to 20 carbons which may be substituted with $Z^5$; and

$Z^5$ is a chlorine atom, a bromine atom, an iodine atom, a nitro group or a cyano group).

3. The charge-transporting varnish according to claim 2, wherein the triarylamine compound is a triphenylamine derivative of formula (5)

(wherein $R^{11}$ to $R^{22}$ are each independently a hydrogen atom, a halogen atom, a nitro group, a cyano group, or an alkyl group of 1 to 20 carbons, alkenyl group of 2 to 20 carbons or alkynyl group of 2 to 20 carbons which may be substituted with $Z^2$, $Z^2$ being the same as defined above).

4. The charge-transporting varnish according to claim 2 or 3, wherein the arylaldehyde compound is a benzaldehyde derivative of formula (6) or formula (7)

(6)

(7)

(wherein $R^{23}$ is a fluorine atom or a fluorinated alkyl group of 1 to 20 carbons;

$R^{24}$ to $R^{27}$ are each independently a hydrogen atom, a nitro group, a cyano group, or an alkyl group of 1 to 20 carbons which may be substituted with a nitro or cyano group; and $R^{28}$ to $R^{32}$ are each independently a fluorine atom or a fluorinated alkyl group of 1 to 20 carbons).

5. The charge-transporting varnish according to claim 1, wherein the oligoaniline compound has formula (8)

(8)

(wherein $R^{33}$ to $R^{38}$ are each independently a hydrogen atom, a halogen atom (exclusive of a fluorine atom), a nitro group, a cyano group, an alkyl group of 1 to 20 carbons, alkenyl group of 2 to 20 carbons or alkynyl group of 2 to 20 carbons which may be substituted with $Z^6$, an aryl group of 6 to 20 carbons or heteroaryl group of 2 to 20 carbons which may be substituted with $Z^7$, —$NHY^2$, —$NHY^3Y^4$, —$C(O)Y^5$, —$OY^6$, —$SY^7$, —$SO_3Y^8$, —$C(O)OY^9$, —$OC(O)Y^{10}$, —$C(O)NHY^{11}$ or —$C(O)NY^{12}Y^{13}$;

$Y^2$ to $Y^{13}$ are each independently an alkyl group of 1 to 20 carbons, alkenyl group of 2 to 20 carbons or alkynyl group of 2 to 20 carbons which may be substituted with $Z^6$, or an aryl group of 6 to 20 carbons or heteroaryl group of 2 to 20 carbons which may be substituted with $Z^7$;

$X^1$ is —$NY^1$—, —O—, —S—$CR^{39}R^{40})_l$— or a single bond, with $R^{39}$ and $R^{40}$ being the same as defined for $R^{33}$;

l is an integer from 1 to 20;

$Y^1$ is independently at each occurrence a hydrogen atom, an alkyl group of 1 to 20 carbons, alkenyl group of 2 to 20 carbons or alkynyl group of 2 to 20 carbons which may be substituted with $Z^6$, or an aryl group of 6 to 20 carbons or heteroaryl group of 2 to 20 carbons which may be substituted with $Z^7$;

$Z^6$ is a halogen atom (exclusive of a fluorine atom), a nitro group, a cyano group, or an aryl group of 6 to 20 carbons or heteroaryl group of 2 to 20 carbons which may be substituted with $Z^8$;

$Z^7$ is a halogen atom (exclusive of a fluorine atom), a nitro group, a cyano group, or an alkyl group of 1 to 20 carbons, alkenyl group of 2 to 20 carbons or alkynyl group of 2 to 20 carbons which may be substituted with $Z^8$;

$Z^8$ is a halogen atom (exclusive of a fluorine atom), a nitro group or a cyano group; and m and n are each independently an integer from 1 to 10 and together satisfy the condition m+n≤10).

6. The charge-transporting varnish according to claim 1, wherein the heteropolyacid compound is phosphotungstic acid.

7. The charge-transporting varnish according to claim 1, which further comprises a curing agent.

8. The charge-transporting varnish according to claim 7, wherein the curing agent is an acrylate curing agent.

9. A charge-transporting film produced using the charge-transporting varnish of claim 1.

10. An electronic device comprising the charge-transporting thin-film of claim 9.

11. An organic electroluminescence device comprising the charge-transporting thin-film of claim 9.

12. An organic electroluminescence device comprising at least a positive electrode, a negative electrode, an emissive layer and the charge-transporting thin-film of claim 9, which device includes the charge-transporting thin-film between the positive electrode and the emissive layer in a form that contacts each of these layers.

13. A method of producing a charge-transporting thin-film, characterized by coating the charge-transporting varnish of claim 1 onto a substrate and evaporating off the solvent.

14. A method of producing an organic electroluminescence device using the charge-transporting thin-film of claim 9.

15. A polymer characterized by being obtained by condensation of a triarylamine compound of formula (1), a fluorine atom-containing arylaldehyde compound of formula (2), and a carbonyl group-bearing fluorene derivative of formula (3) or formula (4), and by having a weight-average molecular weight of from 1,000 to 200,000

(1)

(2)

-continued (3)

(4)

(wherein $Ar^1$ to $Ar^3$ are each independently an aryl group of 6 to 20 carbons which may be substituted with $Z^1$, with at least one constituent carbon atom in each aryl group being unsubstituted;

$Ar^4$ is an aryl group of 6 to 20 carbons which is substituted with at least one $Z^3$ and may also be substituted with $Z^4$;

$R^1$ to $R^8$ are each independently a hydrogen atom, a halogen atom, a nitro group, a cyano group, or an alkyl group of 1 to 20 carbons, alkenyl group of 2 to 20 carbons or alkynyl group of 2 to 20 carbons which may be substituted with $Z^2$;

$R^9$ and $R^{10}$ are each independently a hydrogen atom, an alkyl group of 1 to 20 carbons, (poly)ethylene oxide group of 2 to 20 carbons, alkenyl group of 2 to 20 carbons or alkynyl group of 2 to 20 carbons which may be substituted with $Z^2$, or an alkyl group of 1 to 20 carbons which is substituted with an ethenyl or ethynyl group and may also be substituted with $Z^2$;

$Z^1$ is a halogen atom, a nitro group, a cyano group, or an alkyl group of 1 to 20 carbons, alkenyl group of 2 to 20 carbons or alkynyl group of 2 to 20 carbons which may be substituted with $Z^2$;

$Z^2$ is a halogen atom, a nitro group or a cyano group;

$Z^3$ is a fluorine atom, a fluorinated alkyl group of 1 to 20 carbons, or a fluorinated aryl group of 6 to 20 carbons;

$Z^4$ is a chlorine atom, a bromine atom, an iodine atom, a nitro group, a cyano group, or an alkyl group of 1 to 20 carbons, alkenyl group of 2 to 20 carbons or alkynyl group of 2 to 20 carbons which may be substituted with $Z^5$; and $Z^5$ is a chlorine atom, a bromine atom, an iodine atom, a nitro group or a cyano group).

* * * * *